(12) United States Patent
Sugita et al.

(10) Patent No.: US 7,608,520 B2
(45) Date of Patent: Oct. 27, 2009

(54) METHOD FOR BONDING SUBSTRATE, BONDED SUBSTRATE, AND DIRECT BONDED SUBSTRATE

(75) Inventors: Tomoya Sugita, Neyagawa (JP); Kiminori Mizuuchi, Neyagawa (JP)

(73) Assignee: Panasonic Corporation, Osaka (JP)

( * ) Notice: Subject to any disclaimer, the term of this patent is extended or adjusted under 35 U.S.C. 154(b) by 94 days.

(21) Appl. No.: 10/569,100

(22) PCT Filed: Nov. 4, 2004

(86) PCT No.: PCT/JP2004/016696

§ 371 (c)(1), (2), (4) Date: Feb. 22, 2006

(87) PCT Pub. No.: WO2005/045908

PCT Pub. Date: May 19, 2005

(65) Prior Publication Data

US 2006/0286710 A1 Dec. 21, 2006

(30) Foreign Application Priority Data

Nov. 6, 2003 (JP) .............................. 2003-376858

(51) Int. Cl.
*H01L 21/30* (2006.01)

(52) U.S. Cl. .................... 438/455; 156/281; 156/306.3; 438/457

(58) Field of Classification Search .................. 438/65, 438/106, 107, 108, 117, 406, 455, 456, 457, 438/458, 459; 257/625, 676, 779–783, 784–785; 156/281, 306.3; 117/1
See application file for complete search history.

(56) References Cited

U.S. PATENT DOCUMENTS

| | | | | |
|---|---|---|---|---|
| 4,883,215 A | * | 11/1989 | Goesele et al. | 438/455 |
| 5,334,273 A | * | 8/1994 | Short et al. | 156/87 |
| 5,763,288 A | * | 6/1998 | Sakaguchi et al. | 438/455 |
| 6,846,723 B2 | * | 1/2005 | Ohkubo | 438/455 |
| 6,959,854 B2 | * | 11/2005 | Yokokawa et al. | 228/201 |
| 2003/0037874 A1 | * | 2/2003 | Liau et al. | 156/306.3 |
| 2003/0045030 A1 | * | 3/2003 | Hayashida et al. | 438/110 |
| 2003/0190816 A1 | * | 10/2003 | Buehler et al. | 438/758 |

FOREIGN PATENT DOCUMENTS

| | | | |
|---|---|---|---|
| JP | 5-74926 | | 3/1993 |
| JP | 05267197 A | * | 10/1993 |
| JP | 6-267804 | | 9/1994 |
| JP | 7-283379 | | 10/1995 |
| JP | 8-181296 | | 7/1996 |
| JP | 9-63912 | | 3/1997 |

(Continued)

*Primary Examiner*—Ha Tran T Nguyen
*Assistant Examiner*—Daniel Whalen
(74) *Attorney, Agent, or Firm*—Wenderoth, Lind & Ponack, L.L.P.

(57) ABSTRACT

The present invention relates to a method for laminating substrates, including locating positioning a surface of a first substrate and a surface of a second substrate at positions close to each other, or partially bringing them in partial contact with each other; supplying a volatile liquid between the surface of the first substrate and the surface of the second substrate; and evaporating the volatile liquid so as to laminate the substrates with each other.

23 Claims, 8 Drawing Sheets

FOREIGN PATENT DOCUMENTS

| | | |
|---|---|---|
| JP | 10-297931 | 11/1998 |
| JP | 2000-216365 | 8/2000 |
| JP | 2000216365 A * | 8/2000 |
| JP | 2001-133475 | 5/2001 |
| JP | 2002-313689 | 10/2002 |
| JP | 2003-140214 | 5/2003 |

* cited by examiner

ORIENTATION FLAT

IMAGE OBTAINED FROM
INTERFERENCE MICROSCOPE

IMAGE OBTAINED FROM
INTERFERENCE MICROSCOPE

SUBSTRATE HAVING LARGE WARPING

METHOD FOR BONDING SUBSTRATE, BONDED SUBSTRATE, AND DIRECT BONDED SUBSTRATE

BACKGROUND OF THE INVENTION

1. Technical Field

The present invention relates to a method for laminating a substrate in which plural substrates made of materials such as glass material, semiconductor material, dielectric material, metallic material, ceramic material and the like are laminated with each other so as to obtain a directly joined substrate having very small warping and distortion, and a laminated substrate and a directly joined substrate obtained by means of the method.

2. Related Art

A direct joining technique is known for firmly joining plural substrates made of various materials such as glass material, semiconductor material, ferroelectric material, metallic material, piezoelectric ceramics material and the like with each other with high accuracy without using an adhesive agent and the like, so as to realize a device having various characteristics. The direct joining technique for joining substrates made of different kinds of materials has particularly high usefulness.

Examples of a directly joined substrate obtained by laminating substrates made of different kinds of materials include a directly joined substrate using oxide ferroelectric crystals, directly joined substrates between glass and $LiNbO_3$ crystal substrate (hereinafter, also referred to as a LN crystal substrate) or between glass and a $LiTaO_3$ crystal substrate (hereinafter, also referred to as a LT crystal substrate), and the like. Another example of the material includes semiconductor substrates which are directly joined with each other so as to form a SOI (Silicon On Insulator) substrate, and this method is widely known.

For example, it is expected that a directly joined substrate between substrates made of different kinds of materials such as a glass material substrate, a dielectric material substrate, a metallic material substrate, a semiconductor material substrate and the like is applied to an optical device. In this application, one of the laminated substrates of the directly joined substrate is processed into a thin plate and then subjected to a ridge processing, so that the resultant can be utilized as an optical waveguide-type device.

In general, a functional device such as an optical device is manufactured by a process such as polishing and etching to a directly joined substrate. In the steps of polishing and etching, at the time of holding the directly joined substrate in the process unit, if the directly joined substrate has distortion or warping, the directly joined substrate is not held uniformly and the accuracy of the process is lowered. In particular, in the step of polishing into a thin plate requiring high accuracy and in the step of dry-etching requiring a large area, the magnitude of the distortion of the directly joined substrate has large influence on the characteristics of the device and the yield percentage of the product. Therefore, in order to obtain a functional device with high performance, it is required to reduce distortion and warping by increasing the accuracy of lamination of the directly joined substrate.

Here, conventional methods for manufacturing a directly joined substrate will be described.

For example, there is a method in which substrates located at positions close to each other are slightly pressurized to locally create a tightly attached state, and then, the vicinity of the tightly attached areas is further pressurized to expand the tightly attached areas, thereby allowing the substrates to be tightly attached to each other over their entire surfaces. However, the tightly attached portions are created unevenly if the substrates are distorted prior to attachment. The unevenness of the tightly attached portions results in distortion in the directly joined substrate and causes failed lamination.

A schematic diagram of the state where the distortion is created is shown in FIG. 7. In FIGS. 7A to 7C, the reference numeral 7 denotes a X-cut MgO-doped $LiNbO_3$ crystal substrate (hereinafter, also referred to as a MgO:LN crystal substrate); 8, a X-cut $LiNbO_3$ crystal substrate; and 9, pressurizing means. It is assumed that the surfaces of the MgO:LN crystal substrate 7 and the LN crystal substrate 8 to be joined to each other are optically polished beforehand. As is shown in FIG. 7A, if a part of the MgO:LN crystal substrate 7 is pressurized locally by the pressurizing means 9 in a state where the MgO:LN crystal substrate 7 and the LN crystal substrate 8 are held at positions close to each other, the local pressurization creates a tightly attached state with the substrates distorted. Specifically, since a stress arises from the center of pressurization outwardly on the joined surfaces immediately below the pressurized portions, the surfaces are tightly attached to each other with their crystal grating expanded. When a new portion in the vicinity of the tightly attached areas is pressurized, as shown in FIG. 7B, the new pressurized portion is subjected to a force spreading from the center of the pressurization outwardly, whereas the already tightly attached portion is subjected to stress that extends toward the attachment point, that is, in the direction where the crystal grating shrinks.

As is generally known, the substrates which are capable of directly joining with each other can be tightly attached with each other at high strength even without performing a heat treatment, and their attached portions never detach from each other even if a relatively large force is applied thereto. Therefore, the distortion remains on the attached portions. If the tightly attached state is created starting from the centers of the substrates to be laminated to each other and the attached area is expanded toward the ends of the substrate, as shown in FIG. 7C, a directly joined substrate which is seriously distorted when seen as a whole is formed.

There is a method proposed for reducing the distortion created at the time of lamination described above, and further for removing air bubbles and air voids which will cause faulty lamination and thus induce a decrease in the yield percentage during the mass production of functional devices.

For example, Japanese Unexamined Patent Publication No. 09-63912 describes a method in which escape grooves are formed on substrates so as to remove air bubbles and air voids from the surfaces to be laminated. The escape grooves also reduce the stress exerted at the time of pressurization. However, when two distorted substrates are brought into contact with each other, pressurizing a portion or the entire area the individual substrates is required in order to completely tightly attach the substrates to each other. In this case, although the number of local areas where the substrates are not joined to each other is reduced, large distortion in the directly joined substrate as a wholes apparent.

The situation where distortion is created in this case will be described based on FIG. 8. In FIGS. 8A to 8D, the reference numeral 10 denotes a X-cut MgO:LN crystal substrate; 11 a X-cut LN crystal substrate formed with escape grooves; 12, a pressurizing means; and 13, escape grooves. It is assumed that the surfaces of the MgO:LN crystal substrate 10 and the LN crystal substrate 11 to be laminated to each other are respectively optically polished beforehand. As shown in FIG. 8A, when the MgO:LN crystal substrate is locally pressurized by the pressurizing means 12 in a state where the MgO:LN crystal substrate 10 and the LN crystal substrate 11 are held at positions close to each other, a tightly attached state is created with the substrates distorted because the substrate is locally pressurized. At this time, the escape grooves 13 serve to allow the stress generated on the joined surface to escape. However, depending on pressurizing methods, as shown in FIG. 8B, the substrates are joined with each other at both ends of each escape groove 13 which has absorbed distortion. In this case, large distortion remains on the MgO:LN crystal substrate 10 at its escape grooves 13, which are areas where the substrates are not joined to each other. Further, as shown in FIG. 8C, when the substrates are pressurized at their portions immediately above the escape grooves 13, the substrates are joined with each other with the crystal grating expanded on the escape grooves 13. For this reason, when the pressure is released, as shown in FIG. 8D, the residual stress is exerted to the substrates from the escape grooves 13 outwardly. As a result, the resultant directly joined substrate warps largely.

On the other hand, Japanese Unexamined Patent Publication No. 07-283379 proposes a method in which two substrates are held at positions close to each other and are pressurized by compressed air so as to be laminated with each other. However, distortion is still created due to the pressurizing step as is the case in the foregoing technique, and it is difficult to remove the distortion on the directly joined substrate.

Further, Japanese Unexamined Patent Publication No. 2000-216365 proposes a method for laminating substrates with each other by their own weights under reduced pressure so as to avoid encapsulation of air into the laminated surfaces and reduce the distortion of the substrates. However, since spacers for holding the substrates locally support portions of the substrates, the held substrates originally have distortion due to their own weights. Therefore, the substrates are likely to distort when laminated with each other.

Further, Japanese Unexamined Patent Publication No. 06-267804 proposes, as a method for correcting the warping of a directly joined substrate that includes forming a thin film having a stress on the respective surfaces to be laminated. However, it is difficult to establish a coincidence between the distribution of the distortion of the substrate created in the film formation step and the distribution of the distortion of the substrates to be laminated. There is also a problem that it is required to observe distortion of each substrate in the laminating step, and then select and manage a thin film having stress capable of correcting the distortion. Further, the roughness accuracy on the surface of the film may be poor depending on the material of the thin film to be formed or the film formation method. Forming the direct joint becomes difficult when the roughness accuracy is poor.

Further, all of the methods described above have a problem that significant distortion appears when substrates made of a less rigid, easily deformable material or thin substrates having a thickness of 1 mm or less are laminated with each other. In particular, when crystal substrates made of oxide material are directly laminated with each other, since the crystal substrates have high rigidity, it is very difficult to correct the warping of the substrate by a method such as applying external force thereto after the substrate is obtained by directly joining substrates with warping remaining. Thus, there has been a demand for a lamination method for obtaining a substrate having small distortion and warping.

BRIEF SUMMARY OF THE INVENTION

In order to solve the problems described above, the present invention provides a method for laminating substrates, including the steps of: locating a surface of a first substrate and a surface of a second substrate at positions close to each other or partially bringing them in contact with each other; supplying a volatile liquid between the surface of the first substrate and the surface of the second substrate; and evaporating the volatile liquid so as to laminate the substrates with each other.

In the present invention, air bubbles are removed from the space between the substrates by involvement of the volatile liquid, and a laminated substrate having small distortion can be obtained without air bubbles or air voids remaining on the surfaces to be laminated. Therefore, it becomes possible to obtain a directly joined substrate having warping of 0.1 µm/mm or less (the warping of a 3-inch wafer substrate as a whole is about 8 µm, at maximum). In this manner, when the directly joined substrate is polished into a thin plate, the directly joined substrate is easily held uniformly in a polishing tool, and a functional device can be obtained at a high yielding rate.

In this specification, "laminated substrate" means a substrate obtained by bringing two substrates into contact with each other and then tightly adhering them simply. "Directly joined substrate" means a substrate obtained by further processing the laminated substrate by heat treatment and the like so as to further firmly join the laminated surfaces physically and chemically.

The objectives, characteristics, aspects, and advantages of the present invention will be more apparent from the following detailed description and the attached drawings.

BRIEF DESCRIPTION OF THE DRAWINGS

FIG. 1 is a schematic diagram showing an example of steps in a laminating method of the present invention, where

FIG. 7B is performed.

DETAILED DESCRIPTION OF THE INVENTION

Figure 1A:
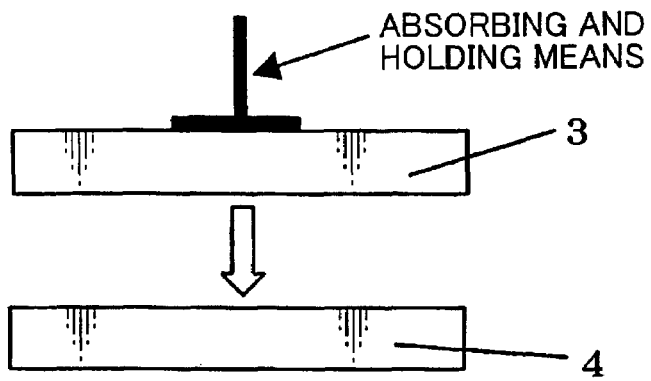
FIG. 1A is a diagram showing a step of holding surfaces to be laminated of a MgO:LN substrate and a LN substrate in a state where the surfaces are faced to each other.

Hereinafter, an embodiment of the present invention will be described.

The present invention is directed for a method for laminating substrates, including: locating a surface of a first substrate and a surface of a second substrate at positions close to each other or partially bringing them in contact with each other; supplying a volatile liquid between the surface of the first substrate and the surface of the second substrate; and evaporating the volatile liquid so as to laminate the substrates with each other.

As a result of the volatile liquid being supplied into the space between two substrates, air bubbles are removed, and air bubbles and air voids do not remain on the surfaces to be laminated. Further, since two substrates are tightly attached to each other by an interfacial tension without substantially pressurizing the substrates themselves, a laminated substrate having small distortion can be obtained. As a result, a function device such as an optical waveguide-type device can be obtained with high quality. In addition, an excellent effect of increasing a yield percentage when these devices are mass-produced can be achieved.

"First substrate" and "second substrate" in the present invention mean substrates to be laminated with each other to form a laminated substrate. Alternatively, these substrates may be laminated beforehand to form a multi-layered structure. Still alternatively, these substrates may be partially formed with a thin film or a circuit. Therefore, the substrates are not specifically limited as long as they are a pair of substrates suitable for manufacturing a directly joined substrate.

Examples of the materials of the first substrate and second substrate in the present invention include various inorganic materials such as glass, semiconductor, ferroelectric body, and piezoelectric ceramics; and substrates in the same kind or different kinds of materials can be used in combination. For example, various oxides such as $LiNb_xTa_{(1-x)}O_3$ crystal ($0 \leq x \leq 1$), MgO doped $LiNbO_3$ crystal, $LiTaO_3$ crystal, and sapphire may be used. Among them, an oxide crystal substrate such as MgO doped $LiNbO_3$ crystal, $LiNb_xTa_{(1-x)}O_3$ ($0 \leq x \leq 1$) crystal and the like is useful for an optical device, and is preferably used as a directly joined substrate thereof.

The thicknesses of the first substrate and second substrate are not specifically limited. In order to prevent distortion from arising due to the factors of the peripheral environment (tools, support table, and the like), either one of the substrates is preferably 0.1 mm or more in thickness. For example, an oxide crystal substrate of 1 mm in thickness can be used. Further, in the present invention, it is preferable that the ratio between the thicknesses of the first substrate and second substrate is large, and that sufficient flatness of the surface on the thicker substrate to be laminated is achieved. The use of the substrates having such different thicknesses from each other further reduces the generation of distortion.

Further, the shapes of the first substrate and second substrate are not specifically limited, and may be disc shape, rectangular shape, and the like. As to the size thereof, when the substrates are in a disc shape, those having a diameter of 3 to 5 inches are preferably used; and when the substrates are in a rectangular shape, those having each side of 10 to 150 mm are preferably used.

In the present invention, in order to provide a surface smoothness suitable for laminating the surface of the first substrate to the surface of the second substrate, it is preferable that at least one of the substrates, and more preferably both of the substrates, are subjected to a smoothing treatment beforehand.

The smoothed surface is preferably a surface having a surface roughness of 10 nmRa or lower measured by a surface shape measuring device (interatomic force microscope, AFM), and more preferably 5 nmRa or lower. If the surface roughness is larger than 10 nmRa, forming of direct joint tends to be difficult due to the influence of the roughness of the surface. Such a smoothed surface can be obtained by machine polishing or mirror polishing. Among them, it is preferable to perform mirror polishing because it achieves high smoothness.

Further, in the present invention, the surface of the first substrate and the surface of the second substrate may be subjected to a step of hydrophilic treatment before the volatile liquid is supplied to facilitate spreading of the volatile liquid. The hydrophilic treatment enables to create a strongly adsorbed state, when the molecules of the volatile liquid existing on the surfaces of the substrate come close to the distance at which intermolecular force thereof influences with each other.

Specific examples of the hydrophilic treatment include, for example, UV irradiation, surface treatment by plasma, and ammonia-hydrogen peroxide treatment by a mixed solution of ammonia water, hydrogen peroxide water, and pure water, and the like. However, the hydrophilic treatment is not particularly limited to these, and any other treatment methods also may be used as long as the treatment enhances the hydrophilic property of the surface. Among them, ammonia-hydrogen peroxide treatment is preferable because it can be performed by a relatively simple device (heater, draft, ammonia water, hydrogen peroxide water, pure water, and the like), and it is excellent in mass productivity.

As to the hydrophilic property of the surface of the substrate in the present invention, it is preferable that the contact angle between the substrate surface and a liquid drop formed by dropping 1 to 10 µL of a water at 20° C. onto the substrate surface is 20 degrees or lower. If the contact angle exceeds 20 degrees, the hydrophilic treatment becomes insufficient and the creation of laminated state tends to be difficult.

Next, in the present invention, a step of locating the surface of the first substrate and the surface of the second substrate at close positions to each other or bringing into partial contact with each other is provided. The close position or partial contact in this step means a state where two substrates are very close to each other, and in some cases, are into partial contact with each other. Specifically, in the case of the close position, these substrates are held with a space of several μm to several tens μm remaining therebetween. However, the space is not specifically limited as long as it is large enough to interpose the volatile liquid to be used in the present invention between the two substrates. Examples of the partial contact include, for example, a state where the first substrate and the second substrates are in contact with each other only at a single portion, a state where they are in contact with each other at plural portions, and the like. Such a partial contact can be achieved by mounting the upper substrate onto the lower substrate by its own weight. In this case, the mirror polished oxide crystal substrates create a space of less than 10 μm therebetween. It is not required that the first substrate and the second substrate are in the same size. It is sufficient that only a portion of one of the substrates to be directly joined is located at a close position or is in partial contact.

The method for locating the surface of the first substrate and the surface of the second substrate at close positions or bringing them into partial contact with each other is not specifically limited. There is a method in which one of the substrates is supported by absorbing and holding means; the substrate is brought to a position close to the other substrate; and the absorbing and holding is released so as to gently place the substrate onto the other substrate.

The orientations of the first substrate and the second substrate are not specifically limited. It is preferable that the crystal axes of the two substrates are oriented to the same direction in order to achieve the direct joint.

Next, in the present invention, a step of supplying a volatile liquid into the space between the surface of the first substrate and the surface of the second substrate is performed. This step is provided to remove air bubbles and air voids existing between the substrates by interposing a volatile liquid between two substrates in the state where the surface of the first substrate and the surface of the second substrate are located at close positions or brought into partial contact with each other. Further, this step is capable of tightly adhering two substrates with each other by evaporation of the liquid substantially without the need to pressurize the substrates.

Means for supplying the volatile liquid is not limited. However, it is preferable that the upper substrate is held in a state where it is located at a position close to the lower substrate or is in partial contact with the lower substrate; the volatile liquid is extruded into the form of drops from a nozzle into the space between the substrates; the liquid is supplied into the space between the substrates by a capillary phenomenon; and then, the upper substrate is released from the held state so as to create a contact state via the liquid by the weight of the upper substrate. Alternatively, the upper substrate is mounted onto the lower substrate by its own weight without holding the upper substrate as is conducted in the above step; a space is created between the substrates by air so as to bring the substrates into partial contact with each other; and the volatile liquid is supplied into the space, as is conducted in the above step. When the compatible liquid is supplied in this state, the air is satisfactorily discharged from the space between the substrates; and thus, air bubbles and air voids are unlikely to remain. Still alternatively, the volatile liquid may be forcedly injected by use of a syringe, pipette, and the like.

The volatile liquid of the present invention is not specifically limited as long as it evaporates and does not remain between the substrates. A liquid having boiling point of 100° C. or lower at 1 atmospheric pressure preferable. Examples of such a volatile liquid include, for example, an organic solvent, water, and a mixture of water and an organic solvent. More specifically, examples thereof include water, a ketone-based organic solvent such as acetone, methyl ethyl ketone, an alcohol-based organic solvent such as methanol and isopropyl alcohol, an ether-based organic solvent such as ethyl ether, a chlorine-containing organic solvent such as chloroform, carbon tetrachloride, 1,1,1-trichloroethane and trichloroethylene, a straight-chain hydrocarbon such as n-hexane, as well as carbon bisulfide, isopropyl acetate, ethyl acetate, gasoline, petroleum ether, petroleum naphtha, petroleum benzene, and the like, and they may be used alone or in mixture thereof. Among them, an organic solvent is preferable. Acetone is especially preferable because it easily spreads over the oxide crystal substrate and evaporates rapidly. If the substrate is of a type that makes it impossible to use an organic solvent, an inorganic solvent may be used as long as it is a volatile liquid and is capable of evaporating.

In the present invention, the injection amount of the liquid depends on the space between the substrates. Therefore, the liquid may be properly supplied in such a manner that the liquid spreads over the entire surface of the substrate as long as the liquid does not damage the effect of the present invention, taking into consideration the way that the liquid spreads out based on the difference in the interfacial tensions and the selection of the liquid and the substrates.

As an example, if the areas to be laminated are S ($cm^2$), the liquid amount to be supplied is preferably S ($cm^2$)×0.001 (cm) or more and S ($cm^2$)×0.01 (cm) or less. If the amount is less than S ($cm^2$)×0.001 (cm), the liquid amount is too small to fail to sufficiently cover the entire substrate surface. On the other hand, if the liquid amount exceeds S ($cm^2$)×0.01 (cm), it requires a long time for complete evaporation of the supplied liquid.

In the present invention, subsequently, the volatile liquid supplied between the substrates is evaporated to remove the liquid from the space between the substrates, so as to laminate the first substrate and the second substrate with each other. To efficiently evaporate the liquid, it is not necessary to evaporate the liquid at normal temperature and normal pressure. Alternatively, the liquid may be efficiently evaporated under heated conditions and at reduced pressure as long as the effect of the present invention is not damaged. For example, when acetone is used as the volatile liquid, it is preferable that the acetone is evaporated at a temperature of 20° to 50° C. at normal pressure or reduced pressure. Taking the manufacture into consideration, it is preferable to perform the evaporation at normal temperature and at normal pressure. In particular, if the evaporation is performed at high temperature, the evaporation step can be shortened; however, the air bubbles and air voids are likely to remain on the substrates. Therefore, evaporation at normal temperature is desired. The time period required for the evaporation also depends on the evaporation temperature of the volatile liquid to be used and pressure. For example, when acetone is supplied as a volatile liquid, the substrates are 3-inch wafers, and the space between the substrates is less than 10 μm, these substrates are kept in contact with each other for two hours during the evaporation at normal temperature and at normal pressure.

In the step of evaporating the volatile liquid in the present invention, there is substantially no step of pressurizing these substrates for bringing them into contact with each other. Therefore, in the case where the upper substrate is not held, it is in contact with the lower substrate by its own weight via the volatile liquid. Then, a state of the contact of the substrates with each other is created as the volatile liquid evaporates. As a result, it becomes possible to reduce the stress causing distortion between the substrates to extremely small.

Here, the creation of the tightly attached state between the laminated substrates by the evaporation of the volatile liquid after supplying said volatile liquid in the present invention will be described in detail.

According to the method of the present invention, the volatile liquid is supplied into the space between the substrates which are located at positions close to each other or are in partial contact with each other, with the result that the substrates are attracted to each other by the attracting force exerted between the liquid and the substrates. Then, these substrates create a tightly attached state therebetween as the volatile liquid evaporates. Therefore, the force required for the substrates to create the tightly attached state is very small and acts very uniformly over the entire surface to which the liquid is involved. As a result, a laminated substrate having small distortion can be easily obtained.

In general, the surface tension of liquid is generated by intermolecular forces inside the liquid, and the wetting property of the liquid on a solid body depends on the surface tension. Specifically, for example, when liquid having large surface tension such as mercury is dropped onto a glass plate, the liquid assumes substantially a shape of ball, and never spreads over the glass plate surface.

On the other hand, water, acetone, and the like are likely to spread over a glass plate and an oxide crystal substrate, and due to a relatively high wetting property. The high wetting property means high attraction (adhesion) to a solid body. Therefore, when liquid having high wetting property is injected in a space between two substrates located at positions close to each other, the liquid rapidly spreads over the entire surface and allows two substrates to attract with each other, thereby creating a tightly attached state therebetween.

In the method for laminating the substrates of the present invention, the distance between the substances gradually decreases as the volatile liquid evaporates, and a distance between the substrates at which intermolecular force acts can be easily created. At this time, in the process where the distance between the substrate decreases, the substrates receive small and uniform force. Therefore, generation of local distortion can be suppressed, thereby obtaining a laminated substrate having very small distortion.

In the present invention, grooves may be formed on the surface of at least one of the first substrate and the second substrate, in order to promote the removal of the volatile liquid supplied to the surfaces to be laminated, to allow the volatile liquid remaining on the surfaces to be laminated to efficiently leave therefrom, and to form an optical wave guide, and the like.

In conventional methods where the surfaces to be laminated are tightly attached to each other by pressurization, although the grooves formed on the surface to be laminated serves to locally reduce stress, they may cause distortion of the resultant directly joined substrate as a whole. On the other hand, in the method where the substrates are laminated by utilizing the surface tension of the liquid as is the method of the present invention, there is substantially no generation of distortion caused by external pressurization. Therefore, even if the grooves are formed, a laminated substrate having small distortion can be obtained.

The cross-sectional shape of each groove to be formed is not specifically limited, and may be in the form of a triangle, a square (such as a true square, rectangle, trapezoid, and the like), a circle, an oval, and the like, as shown in FIGS. 2A to 2D, for example. In FIG. 2, the reference numeral 21 denotes a first substrate; 22, a second substrate; and 23, a groove to be formed. It is not required for all the grooves 23 to assume the same shape. For example, when plural grooves are formed in accordance with an objective, the grooves may have different shapes in accordance with the objective. It is also possible to form grooves having two or more kinds of cross-sectional shapes with different depths from each other.

Further, the depth of each groove may be selected in accordance with an objective. A groove may be formed with a taper so that the depth is continuously increased, or a groove may be formed with plural depths stepwise. For example, when a groove is formed with its depth gradually increased toward the outer peripheral portion of the substrate, the volatile liquid can be uniformly diffused inside the substrate by a capillary phenomenon and also efficiently evaporated for removal.

The width of the groove is preferably 100 μm or smaller, and a depth of the groove is preferably 0.1 μm or larger. If the width and depth of the groove fall out of these ranges, the groove tends to deform when the directly joined substrates is polished into a thin plate. When an optical waveguide-type device is manufactured for example with such a deformation of the grooves formed, the device tends to have an increased propagation loss.

In order to remove the volatile liquid, at least one or more portions of the end of the groove preferably reaches to the end of the substrate.

In the formation of the groove, it is preferable that the groove is formed without being distributed unevenly toward one side on the surface to be laminated. Specifically, when a virtual center line is drawn on the surface to be laminated of the first substrate or the second substrate, the grooves are preferably arranged with good balance in such a state that the grooves are formed to be substantially symmetrical with respect to the virtual center line. Here, the virtual center line means a center line capable of achieving a substantially linear symmetry of the arrangement pattern of the groove.

When plural grooves are formed in a state where they are concentrated on one portion on the surface of the substrate, the contact areas become unbalanced on the portions of the surface, and distortion tends to arise.

The arrangement of the grooves on the substrate surface is not specifically limited, and may be in form of dots, stripes, lattices, and the like. Among them, the form of lattices is preferable because this form can disperse the stress of warping of the laminated substrate.

Figure 3:
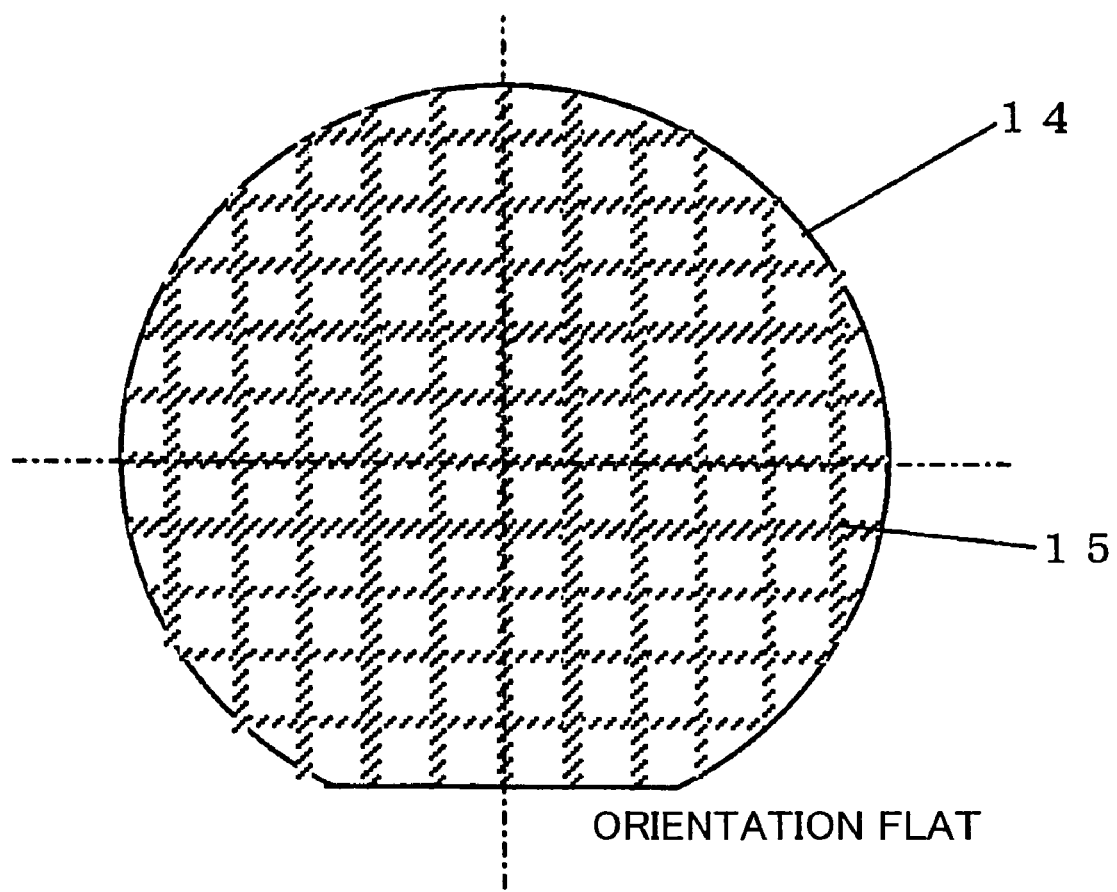
FIG. 3 is a schematic diagram showing an example of an arrangement of grooves on the LN substrate.

If the groove is formed with a balanced arrangement without being located at a position aligned toward one side on the surface, the generation of distortion is reduced when the substrate is seen as a whole, even if local distortion arises. Specifically, when the grooves are in the form of lattices, as is shown in FIG. 3, and the depth and the width of the grooves are the same (they have the same vertical cross-sectional shape), distortion is small. FIG. 3 is a schematic diagram showing an example of the arrangement pattern of grooves. In FIG. 3, the reference numeral 14 denotes the first or second substrate; 15 denotes grooves formed into the shape of lattices.

Further, the surface of at least either one of the first substrate and the second substrate is formed with a thin film made of a dielectric material or a metallic material. In general, the thickness of a thin film is controllable with high accuracy to be uniform. A dielectric body is capable of achieving various refractive indexes and absorption coefficients by a selection of the material, and therefore, a direct joint via a thin film of a dielectric body is preferable as a method of manufacturing a directly joined substrate. In particular, a material low in loss of the wave guide light is selectable for an optical waveguide-type device. For example, as compared with a method in which an optical device is manufactured by use of a joined substrate formed by bonding, a method which uses a directly joined substrate including a dielectric thin film at its portion to be in contact with an optical wave guide is advantageous.

In the case where the substrates each formed with a film are tightly attached to each other by a conventional technique of pressurization, it has been required to coincide the distributions of the distortions of the substrates generated during the film formation step with the distributions of the distortions generated due to the characteristics (differences in the thicknesses, shapes, material characteristics and the like) of the substrates to be laminated. However, in the method of the present invention in which the substrates are laminated by utilizing the surface tension of the liquid, there is no substantial distortion is generated by external pressurization. Therefore, since even the distributions of the distortions on the substrates each formed with a film can be coincided with each other, the distortion can be decreased. In particular, since the distortion generated during the film formation can be controlled by the conditions of film formation, a laminated substrate having small distortion can be obtained.

As an example of a method of forming thin film, there is a method in which a metallic oxide such as $SiO_2$, SiN, low-melting point glass, $Ta_2O_5$, and the like is formed into a thin film by sputtering and the like. A preferable thickness of the thin film is 10 to 400 µm.

The laminated substrate obtained in the method of the present invention is further subjected to heat treatment in order to achieve further increased strength of tight attachment and fixation. After the heat treatment, the resultant laminated substrate (the directly joined substrate) is in a further firmly joined state. The heating method is not specifically limited, and a method using an oven may be employed. As to the heating conditions, if the temperature is sharply raised, distortion tends to be created. Therefore, it is preferable that the temperature is raised at a rate of 50 to 500° C./hour. Further, although it depends on the material of the substrate, it is normally preferable that the temperature is raised to 300 to 1000° C., preferably 350 to 800° C., and the substrate is kept at the maximum temperature for about 1 to 3 hours, and then the heating is stopped and the substrate is gradually cooled down. The directly joined substrate obtained according to the present invention can maintain low distortion property and low warping property even if it is subjected to the heat treatment.

For example, a directly joined substrate obtained from the laminated substrate of the present invention can have a distortion of 0.1 µm/mm or smaller in a 3-inch sized substrate having a thickness of 0.5 to 1.0 mm. Therefore, the directly joined substrate is applicable in a device manufacturing of a high-accuracy process.

The obtained directly joined substrate having small distortion and warping is preferably used in applications including optical devices such as optical waveguide devices and functional devices.

Hereinafter, an embodiment of the present invention will be more specifically described. The description will refer to a direct joint of oxide dielectric crystal substrates wherein a LN crystal substrate and a MgO:LN crystal substrate of ferroelectric crystals are the substrates directly joined. However, the present invention is not limited to this structure.

Substrate distortion of the laminated substrate and the directly joined substrate obtained by use of the method of the present invention and the effectiveness of the directly joined substrate having very small warping will be described.

In this embodiment, "substrate distortion" means a state where the flatness of the substrate surface changes undirectionally with respect to the external reference surface having high flatness (for example, a state where flatness of 150 nm or less is secured within a surface having a diameter of 50 mm). Further, "substrate warping" means a state where the substrate curves with respect to the external reference surface because of the accumulation of the substrate distortions.

Hereinafter, the method for laminating substrates, the laminated substrate, and the directly joined substrate of the present invention will be specifically described.

FIG. 1 shows a step of the present invention in which a volatile liquid is injected and the substrates are attracted to each other by surface tension to create a tightly attached state therebetween. In FIGS. 1A to 1D, the reference numeral 3 denotes a X-cut MgO:LN crystal substrate (diameter: 3 inches φ, thickness: 0.5 mm, surface roughness: 5 nmRa or lower, substrate warping: 0.1 µm/mm or lower); 4, a X-cut LN crystal substrate (diameter: 3 inches φ, thickness: 1.0 mm, surface roughness: 5 nmRa or lower, substrate warping: 0.1 µm/mm or lower); 5, a nozzle to be used as liquid injection means; and 6, acetone as a volatile liquid.

The surfaces of MgO:LN crystal substrate 3 and the LN crystal substrate 4 to be laminated to each other are subjected to optical (mirror) polishing beforehand. In this embodiment, acetone is selected as the volatile liquid, but the same effect of the acetone can be achieved with water or alcohol. However, in order to create a tightly attached state in a short period of time, it is preferable to use an organic solvent such as alcohol, acetone, and the like which evaporates at high speed at normal temperature.

In the method for laminating the substrates illustrated in this embodiment, first, the surface to be laminated of the MgO:LN crystal substrate 3 and the surface to be laminated of the LN crystal substrate 4 are subjected to a hydrophilic treatment. Specifically, the respective surfaces to be laminated of the MgO:LN crystal substrate 3 and the LN crystal substrate 4 are subjected to ultrasonic cleaning by acetone. After that, the substrates are soaked into a mixed solution of ammonia water, hydrogen peroxide water, and pure water in a ratio of 1:1:6 for 15 minutes or longer, and then, rinsed with pure water and dried.

After hydrophilic treatment, as shown in FIG. 1A, the MgO:LN crystal substrate 3 and the LN crystal substrate 4 are held with their crystal axes aligned in the same direction, and the surface to be laminated of the MgO:LN crystal substrate 3 and the surface to be laminated of the LN crystal substrate 4 are located at positions close to each other. In this state, a tightly attached state is not created between the substrates, and the distortions of respective two substrates to be laminated do not influence to each other. Further, as long as the surfaces to be laminated of two substrates are not completely in parallel with each other, even when the held state of the MgO:LN crystal substrate 3 located at the upper side in FIG. 1A is released, a clearance is created between the substrates, and therefore; there arises almost no tightly attached state between the substrates. In this embodiment, the MgO:LN crystal substrate 3 is mounted on the LN crystal substrate 4, and a volatile liquid is supplied therebetween. After that, the held state of the upper substrate 3 is released as described below. Therefore, the MgO:LN crystal substrate 3 comes to oppose to the LN crystal substrate 4 via the volatile liquid by its own weight.

Figure 1B:
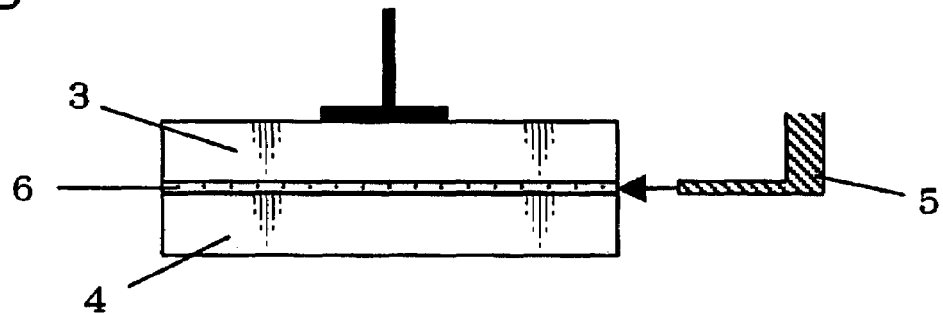
FIG. 1B is a diagram showing a step of holding the MgO:LN substrate and the LN substrate located at positions close to each other and supplying a volatile liquid thereto.
Figure 1C:
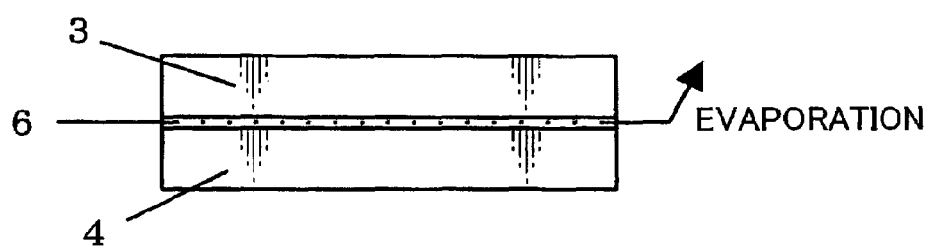
FIG. 1C is a diagram showing a step of forming a state of tightly attaching the MgO:LN substrate and the LN substrate with each other through the volatile liquid.
Figure 1D:
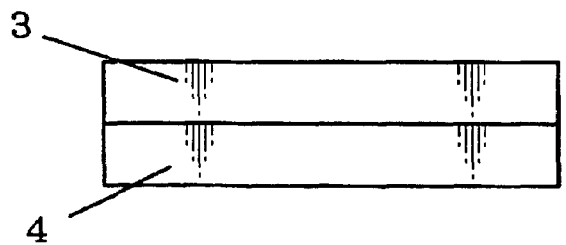
FIG. 1D is a diagram showing a step of laminating the MgO:LN substrate and the LN substrate with each other by evaporation of the volatile liquid.
Figure 2A:
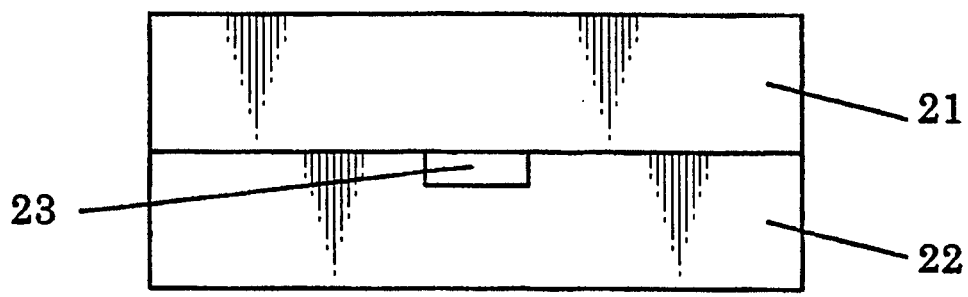
FIG. 2 is a schematic diagram showing an example of a vertical cross-sectional shape of a groove.
Figure 2B:
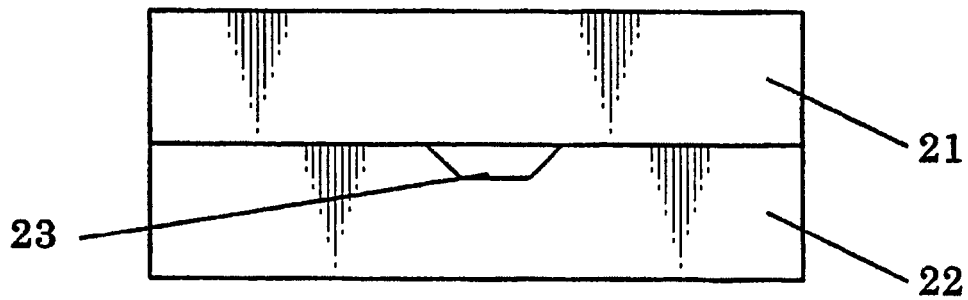
Figure 2C:
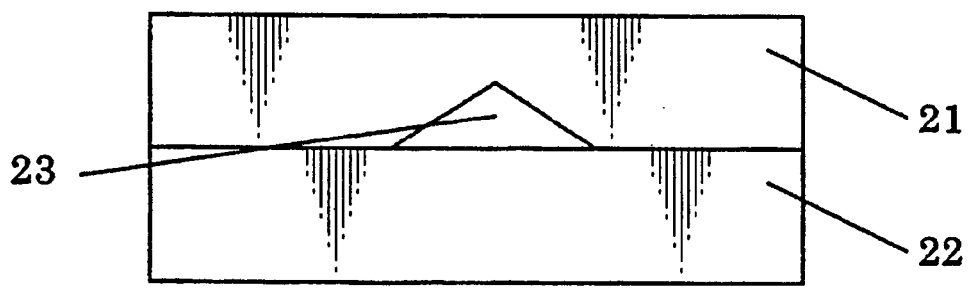
Figure 2D:
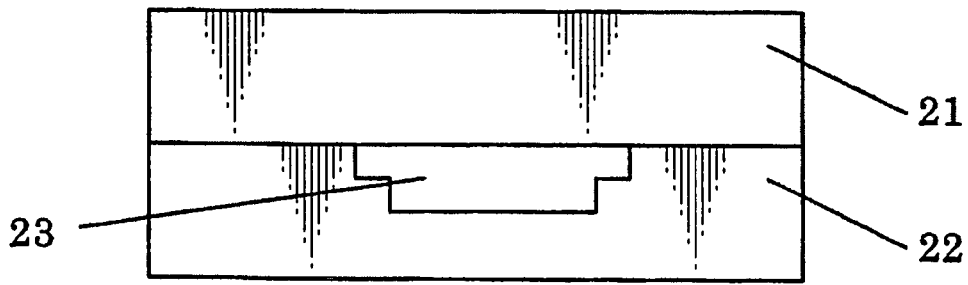

Next, as shown in FIG. 1B, 200 µL of acetone 6 is injected between the surfaces to be laminated of the substrates using the nozzle 5. The acetone 6 instantaneously spreads out between the substrates located at close positions to each other, and as shown in FIG. 1C, a tightly attached state is created via the acetone 6 in a space less than 10 µm. In this state, the held state of the substrate is released at normal temperature and at normal pressure, and then the distance between the substrates decreases as the acetone 6 evaporates, and finally, a laminated substrate having no substance interposed in an intermediate portion, as shown in FIG. 1D, is obtained.

The obtained laminated substrate can be further subjected to heat treatment in order to increase the strength of the tight attachment and fixation. The laminated substrate obtained in the present invention involves neither generation nor increase in the distortion even by the heat treatment. An oven is used in the heat treatment, and the heating is performed by raising the temperature from 25° C. to 500° C. at a raising rate of 100° C./h in order to prevent peeling of the joined substrate and breakage due to rapid heating. The laminated substrate is held at 500° C. for 1 hour, and then the temperature is lowered. In this manner, the directly joined substrate is obtained.

Figure 5A:
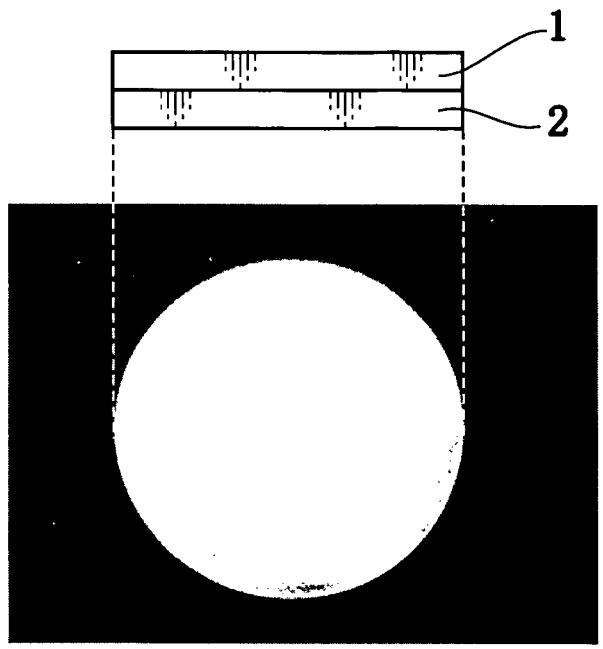
FIG. 5A is an interference microscope image showing warping of a directly joined substrate formed of a MgO:LN substrate and a LN substrate obtained by the method of the present invention.

Here, an example of the result of measuring the distortion of the directly joined substrate made of the MgO:LN crystal substrate and the LN crystal substrate obtained in the first embodiment is shown. In FIG. 5A, the reference numeral 1 denotes a X-cut MgO:LN crystal substrate; and 2, a X-cut LN crystal substrate. Further, FIG. 5A shows an image of the directly joined substrate observed by an interference microscope.

The evaluation of the distortion is performed by observing the image obtained from an interference microscope. In the observation of the image obtained from the interference microscope, the degree of parallelization of the surface of the substrate to be measured with respect to the external reference surface having high flatness with an accuracy of 150 nm or lower can be visually observed as described above. In this observation, the magnitude of the warping of the substrate can be evaluated.

In the observation of the image obtained from the interference microscope, the surface of the substrate to be measured is irradiated through the reference surface with light from a laser beam source having a wavelength of 633 nm, and the inclination (the flatness) of the surface of the substrate with respect to the reference surface can be measured from the interference state of the reflected lights from the reference surface and the substrate surface.

In the image obtained from the interference microscope, the difference in the optical path from a bright portion to the adjacent bright portion (or a dark portion to the adjacent dark portion) in the interference stripes is about 0.3 µm. Therefore, if the directly joined substrate to be measured absolutely has no warping, it is possible to obtain an observed image having no interference stripes by adjusting the angle of the stage on which the substrate is held so as to render the surface of the substrate to be completely parallel to the reference surface.

The magnitude of the warping is evaluated in the following manner: when moving from an arbitrary point A to an arbitrary point B on the surface of the directly joined substrate, the difference in the distances from the reference surface respectively to the point A and to the point B is measured; and the magnitude of the warping is evaluated from the deviation (µm/mm) in the distance from the reference surface to the surface of the directly joined substrate with respect to the positional deviation of 1 mm.

Specifically, when 20 interference stripes are observed concentrically from the center of the observed image as the observed image obtained from the interference microscope, since there arises a difference in the optical paths per one interference stripe, that is, 0.3 µm as a difference in the distances from the reference surface, it is understood that the peripheral portion warps about 6 µm with respect to the center portion of the observed image. In this case, on an assumption that the size of the field of view for observation is φ50 mm for example, the magnitude of warping of the substrate results in 0.12 µm/mm.

Figure 5B:
FIG. 5B is an interference microscope image of a directly joined substrate obtained by a conventional technique that has large warping.

For comparison, an interference microscope image of the directly joined substrate manufactured by means of a conventional method for laminating substrates is shown in FIG. 5B. The magnitude of the substrate warping of the substrate observed in FIG. 5B was about 0.8 µm/mm. This value corresponds to a very large substrate warping of 60 µm or larger when seen in a 3-inch wafer as a whole. As is shown in the observed image obtained from the interference microscope of FIG. 5A, the warping of the directly joined substrate manufactured by use of the method for laminating substrates of the present invention is very small, being 5 µm or less (0.1 µm/mm or less), and is applicable to a device manufactured using a high-accuracy process.

Further when grooves are formed on the surface to be joined of at least one of the substrates to be laminated, a directly joined substrate having small distortion can be obtained, as is the case described above. The grooves to be formed on the surface to be laminated promote the removal of the volatile liquid supplied onto the surface to be laminated. For example, in the heat treatment as well, there is an effect that water molecules or remaining acetones on the surface to be joined can be efficiently discharged from the directly joined substrate. In the conventional technique, although the grooves formed on the surface to be laminated serve to reduce a local stress during the pressurizing step, they cause distortion in the directly joined substrate as a whole. However, in the method for laminating the substrates according to the present invention since substantially no distortion is generated by external pressurization, a laminated substrate having small distortion can be obtained. In particular, if the grooves are formed in a pattern in which the formed direction, width, length, and depth thereof are substantially uniform on the surfaces, for example, in the form of lattices such as shown in FIG. 3, the generation of distortion can be further reduced. It is desirable for the function of the grooves that at least one or more portions of the grooves reach to a side end of the surface of the directly joined substrate.

Figure 4:
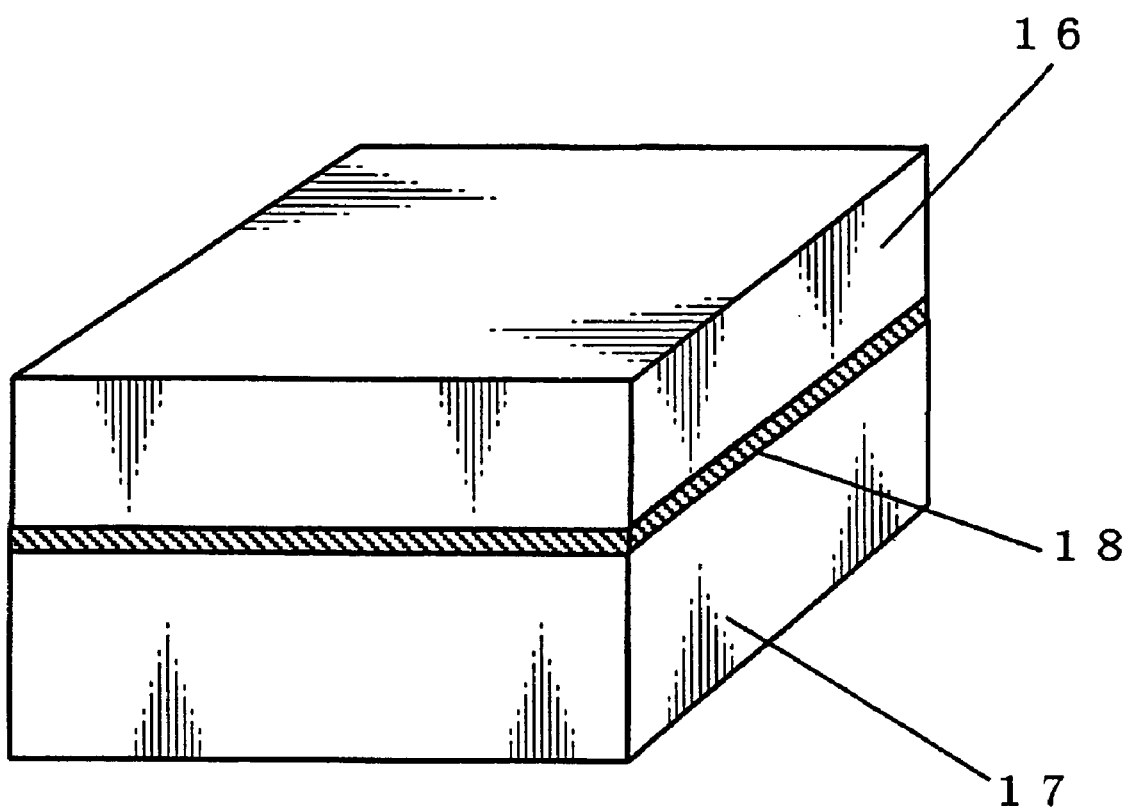
FIG. 4 is a schematic diagram showing an example of a directly joined substrate formed by laminating a MgO:LN substrate and a LN substrate with a thin film made of $Ta_2O_5$ accumulated on their respective surfaces.

A thin film made of dielectric material or metallic material may be accumulated onto the surface to be laminated of a substrate, as shown in FIG. 4. In FIG. 4, the reference numeral 16 denotes a X-cut MgO:LN crystal substrate; 17, a X-cut LN crystal substrate; and 18, a thin film made of dielectric material accumulated on the MgO:LN crystal substrate 16. In this embodiment, $Ta_2O_5$ is used as the thin film 18, and the thickness thereof is 100 to 400 nm. The thin film 18 is accumulated on the MgO:LN crystal substrate by sputtering.

Next, in order to form an optical waveguide device as an application of the directly joined substrate, as will be described later, the surface of the directly joined substrate is polished into a thin plate, and finally, the thickness of the crystal substrate can be reduced to 3 to 4 µm. The polishing into a thin plate for the purpose of manufacturing an optical device such as optical guide wave path is requires very high accuracy, achieving a thickness accuracy of ±0.1 µm or less. Therefore, the magnitude of distortion or warping of the directly joined substrate directly influences on the characteristics and manufacturing yield of the device. The use of the directly joined substrate having small distortion obtained in the method of the present invention enables the surface to be uniformly held on the polishing tool. For example, the polishing with high accuracy can be achieved over the substantially entire surface of the 3-inch substrate.

A directly joined substrate obtained in the method of the present invention will be described.

The optical waveguide-type device of the crystal substrate made of semiconductor or oxide material is effective means for achieving a micro-sized functional device. Conventionally, by rendering functional crystals with an optical wave guide, there have been many small-sized functional devices studied and developed such as a grating device, a switching device, a wavelength converting device, and the like. In general, an optical wave guide is formed on these crystal substrates by utilizing the change in the local refractive index caused by doping impurities. However, since the doping of impurities causes deterioration in the functionality (light transmission rate, nonlinear optical constant, and the like) of the crystal substrate in many cases, there has been a demand for a new method for forming optical wave guide. As means for solving the problem described above, a direct joint technique, and particularly, a directly joined substrate made of different kinds of materials has been studied. For example, after the crystal substrate made of a functional material and a Si substrate are directly joined, the crystal substrate made of the functional material is polished into a thin plate using the Si substrate as a supporting base, and then is processed into a ridge shape. As a result, a three-dimensional optical wave guide made of functional material undoped with impurities is obtained.

The most important point in the optical waveguide-type functional device is to control the propagation constant of the light guided through the optical wave guide and to achieve uniformity thereof. If the propagation constant is not uniform, the device characteristics will be poor. For example, in the case where the directly joined substrate is utilized in a grating device, if the propagation constant changes in the propagating direction of the optical wave guide, an effective periodical structure of the grating is disturbed. As a result, the diffraction efficiency is lowered. Further, in the case where a directly joined substrate is utilized in a switching device such as an optical converter, if a distribution is created in the propagation constants, the S/N ratio is seriously lowered.

Further, in the case where the directly joined substrate is utilized in a nonlinear optical device represented by a wavelength converting device, if the propagation constants are not uniform, the phase alignment conditions are disturbed. As a result, the conversion efficiency is seriously lowered. For this reason, in the optical waveguide-type device utilizing a conventional directly joined substrate, its application is limited and the manufacturing yield is largely influenced. In particular, in a device which performs optical control by means of propagation constants using a single-mode optical wave guide, a demand for the uniformity of the propagation constants is severe, and it has been difficult to secure the characteristics on the mass-production level.

In the optical waveguide-type device using a directly joined substrate, the distortion and warping of the substrate create problems on two points, that is, (A) the shape of optical wave guide and (B) the distribution of the refractive index by a local stress to the optical waveguide path.

The first problem is that the distortion and warping of the substrate exerts a large influence to the shape of the optical wave guide. As described above, in the case where the optical waveguide-type device is manufactured using the directly joined substrate, the step of polishing into a thin plate and the step of ridge processing are important steps. From the viewpoint of the device designing, device characteristics, and yield percentage, it is important to polish the directly joined substrate into a uniform thickness in the step of polishing into a thin plate. Therefore, it is important to enhance the flatness of the substrate.

Further, since processes such as dicing and dry etching are employed in the step of ridge processing, the flatness of the joined substrates exerts a large influence to the processing accuracy. Therefore, it is important to reduce the distortion and warping of the directly joined substrate.

In order to study the correlation between the warping and the processed shape, the direct joint of different kinds of materials between a $LiNbO_3$ crystal substrate of 3-inch wafer and a MgO doped $LiNbO_3$ crystal substrate of 3-inch wafer has been examined. As a sample (1), a directly joined substrate having warping of (1) 0.1 μm/mm or lower which is the limit of the measurement by the evaluation method, was prepared by the lamination method using the volatile liquid of the present invention shown in the first embodiment. In addition, as samples (2) and (3), directly joined substrates respectively having warping of (2) 0.5 μm/mm and (3) 1.0 μm/mm were prepared by conventional methods including a pressurizing step. Then, the respective variations within the surface in the processed shapes resulted from the step of polishing into a thin plate were compared with each other.

As the step of polishing into a thin plate, each directly joined substrate was polished into a thickness of about 20 μm. Subsequently, the substrate was further polished into a thickness of about 10 μm by diamond abrasive grains (grain diameter: 1 μm), and was further polished into a thickness of 3 to 4 μm by colloidal silica (grain diameter: 0.05 to 0.1 μm).

Figure 6A:
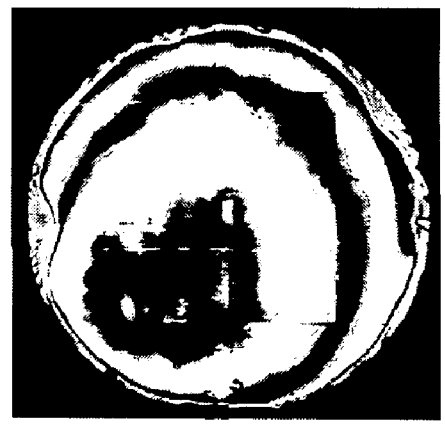
FIG. 6A is an interference microscope image showing the distribution of the thickness achieved after the final polishing when a directly joined substrate having warping of 0.1 µm/mm or less is polished into a thin plate.
Figure 6B:
FIG. 6B is a similar image of the distribution of the thickness achieved after the final polishing when a directly joined substrate having warping of 0.5 µm/mm is polished into a thin plate.
Figure 6C:
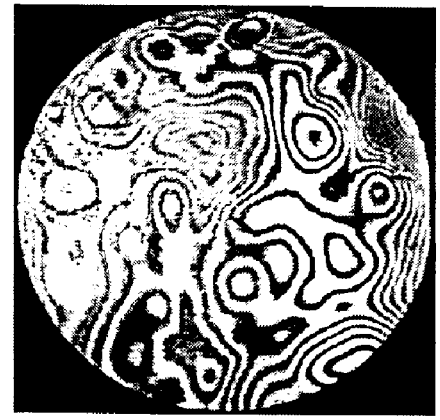
FIG. 6C is an image of the distribution of the thickness achieved after the final polishing when a directly joined substrate having warping of 1.0 µm/mm is polished into a thin plate.
Figure 7A:
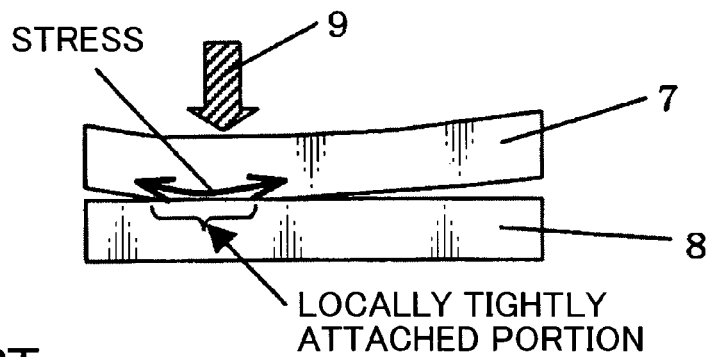
FIG. 7A is a schematic diagram showing stress generated within a substrate when a MgO:LN substrate and a LN substrate are tightly attached and fixed to each other by local pressurization.
Figure 7B:
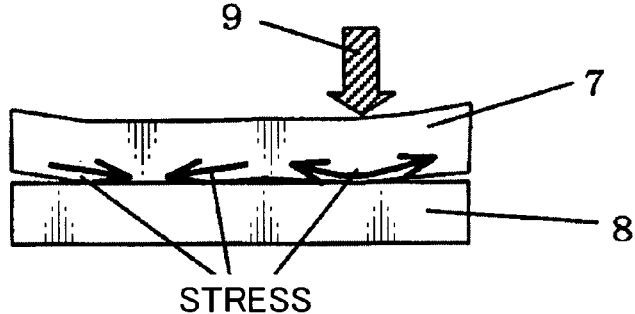
FIG. 7B is a schematic diagram showing stress generated within a substrate when other portions of the MgO:LN substrate are locally pressurized in addition to the local pressurization of FIG. 7A.
Figure 7C:
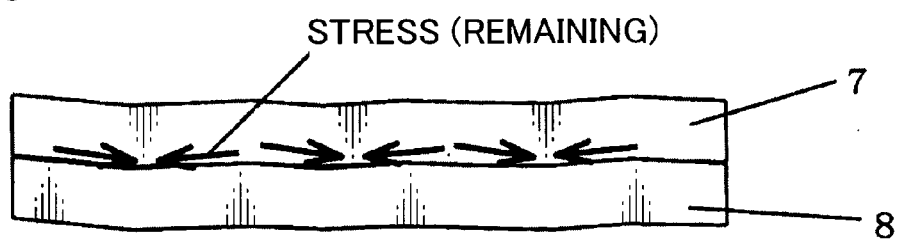
FIG. 7C is a schematic diagram showing a distorted state of the laminated substrate caused when the local pressurization illustrated in FIG. 7A
Figure 8A:
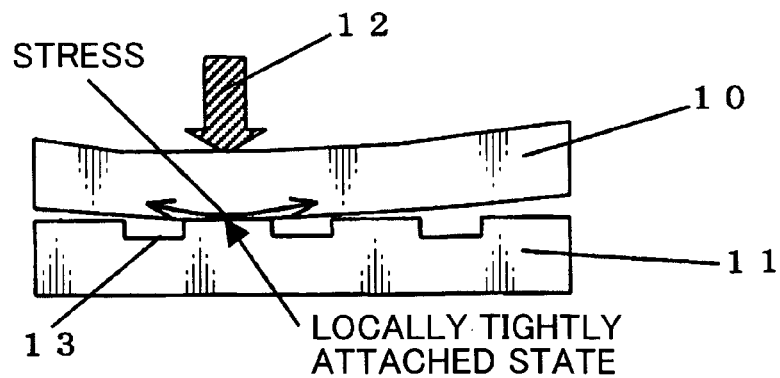
FIG. 8A is a schematic diagram showing stress generated within a substrate when a MgO:LN substrate and a LN substrate formed with escape grooves are tightly attached and fixed to each other by local pressurization.
Figure 8B:
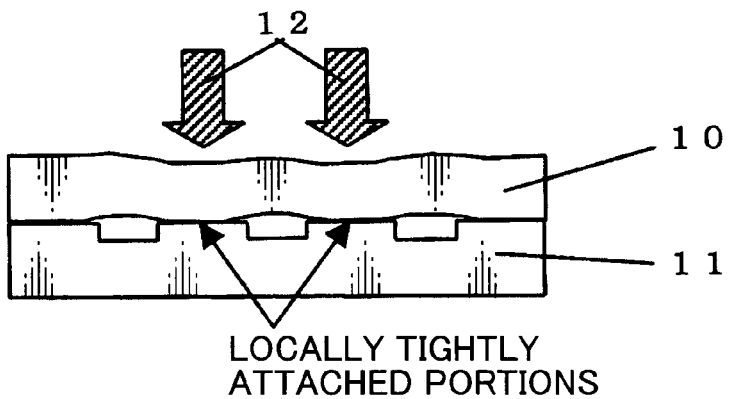
FIG. 8B is a schematic diagram showing a distorted state of a laminated substrate caused when the local pressurization illustrated in FIG. 8A is performed.
Figure 8C:
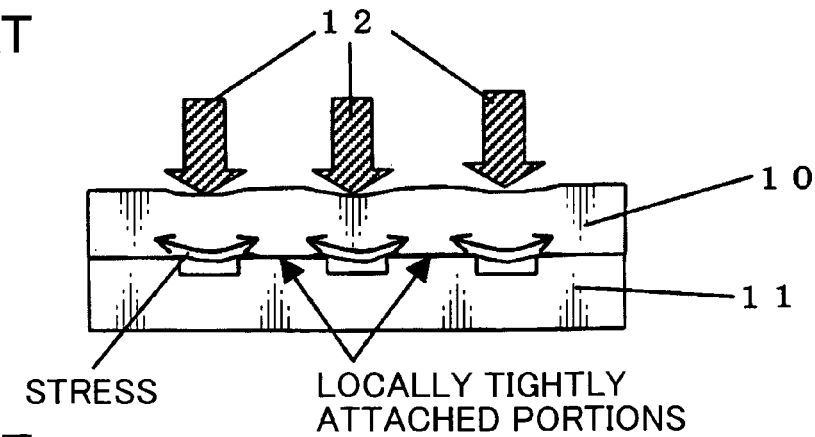
FIG. 8C is a schematic diagram showing stress generated within a substrate when a MgO:LN substrate and a LN substrate formed with escape grooves are tightly attached and fixed to each other by local pressurization applied to the portion above the grooves.
Figure 8D:
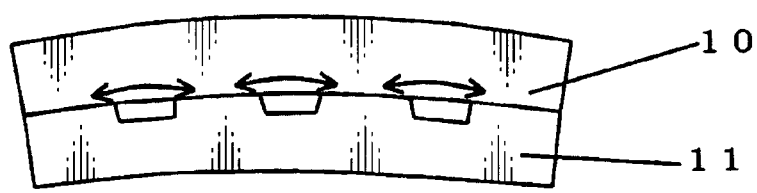
FIG. 8D is a schematic diagram showing a distorted state of the finally laminated substrate caused when the local pressurization of FIG. 8C is performed.

FIGS. 6A to 6C show the distribution of the thicknesses after the polishing step observed by an interference microscope when each joined substrate was polished into a thin plate. FIG. 6A shows an image obtained from the interference microscope of a substrate (1) having warping of 0.1 μm/mm or less; FIG. 6B shows an observed image obtained from the interference microscope of a substrate (2) having warping of 0.5 μm/mm; and FIG. 6C shows an observed image obtained from the interference microscope of a substrate (3) having warping of 1.0 μm/mm. The substrate (3) having warping of 1.0 μm/mm was difficult to laminate uniformly to a polishing zig in the step of polishing into a thin plate, and there was a large variation in the thicknesses after the final polishing. As is understood from FIGS. 6A to 6C, there is a clear correlation between the warping of the directly joined substrate and the variation in thicknesses after the final polishing.

For example, when a device of 10 mm in length in the optical wave guide propagating direction is prepared from the viewpoint of the processed shape, the thickness distribution shown in FIG. 6A or 6B is preferable. Further, from the viewpoint of the yield percentage in mass production, the thickness distribution shown in FIG. 6A is further preferable. Specifically, preferable warping of the directly joined substrate is 0 to 0.5 μm/mm from the viewpoint of the processing accuracy, whereas preferable warping of the directly joined substrate is 0 to 0.1 μm/mm from the viewpoint of the yield percentage in mass production.

Further, in comparison between the wavelength converting efficiencies in the case where the directly joined substrates after being polished into thin plates respectively convert the light emitted from 820 nm semiconductor lasers into light having a wavelength of 410 nm, the wavelength converting efficiency is 300 to 350%/W in the case of using the directly joined substrate (1) having warping of 0.1 μm/mm or less. Contrary to this, the wavelength converting effect is 200 to 280%/W in the case of using the directly joined substrate (2) having warping of 0.5 μm/mm or more. Further, the wavelength converting efficiency is 70%/W or less in the case of using the directly joined substrate (3) having warping of 1.0 μm/mm. The warping of substrate appears as the difference in the wavelength converting efficiencies.

The second problem is that the stress locally concentrates, resulting in generating a distribution of the refractive indexes. The generation of the distribution of said refractive indexes influences the device characteristics. When an optical wave guide is formed, the warping of the substrate causes a change in the distribution of the refractive indexes. Further, for example, the distribution of the stresses in the propagating direction of the optical wave guide or in the depth direction of the optical wave guide possibly changes the refractive index effectively. In particular, the distribution of the refractive indexes in the propagating direction of the optical wave guide seriously degrades the device characteristics. From this viewpoint, the directly joined substrate made of laminated substrates by the method substantially including no pressurizing step of the present invention has extremely reduced stresses including an internal stress, and therefore, is preferably used.

Here, examples of an optical waveguide-type nonlinear optical device will be described.

For example, when an optical wave guide having a periodic polarization inverted structure is formed on a MgO:LN crystal substrate, a wavelength converting device with high efficiency is obtained. The wavelength converting device is a device capable of converting a basic wave propagating through the optical wave guide into harmonic having a different wavelength. The wavelength converting device, in which the propagating constants of the basic wave and harmonic are coincided with each other over the entire length of the optical wave guide, is capable of converting the wavelength at high efficiency. However, the local concentration of the stress due to the warping of the substrate causes a change in the refractive index. This change in the refractive index creates distribution of the propagating constants, and reduces the converting efficiency of the wavelength.

Further, it is conceivable that the reduction in the wavelength converting efficiency involves the disturbance of the periodicity of the periodic polarization inverted structure caused by a change in the refractive index due to the local stress. The periodic polarization inverted structure is obtained by forming electrodes in a periodic pattern by photolithography and dry etching before performing a direct joint, and then applying a high voltage electric field. The periodic polarization inverted structure is designed for the optical wave guide having uniform propagating constants, and is based on the premise that the optical wave guide shape and the refractive index are constant over the entire length of the device. The photolithography process is capable of forming a periodic pattern with an extremely high accuracy, and the resulting periodic polarization inverted structure is also in a uniform period. However, if there is a distribution of refractive indexes appearing due to the stresses described above, the effective refractive index randomly changes within the optical wave guide (according to the states of distortion and warping of the substrate). Therefore, the uniformity of the periodic structure may possibly be damaged. In any case, it has been found that the warping of substrate has a large influence on the device characteristics. From the viewpoint of the device characteristics, it is desirable that the warping of substrate is 0 to 0.5 μm/mm; and taking into consideration the surface uniformity and the yield percentage of the device, it is preferable that the warping of substrate is 0 to 0.1 μm/mm.

Although the present invention has been described in detail, the foregoing descriptions are merely examples on all the aspects, and the present invention is not limited thereto. An infinite number of modifications which are not exemplified are assumed without departing from the range of the present invention.

The invention claimed is:

1. A method for laminating substrates, comprising:
positioning a lower surface of an upper substrate adjacent to an upper surface of a lower substrate such that the upper surface and the lower surface are mutually facing so as to define an air space between the lower surface and the upper surface;
after said positioning of the lower surface of the upper substrate adjacent to the upper surface of the lower substrate so as to define the air space, interposing a volatile liquid into the air space between the lower surface of the upper substrate and the upper surface of the lower substrate so as to replace air in the air space and cause an attracting force to arise between the volatile liquid and the upper and lower substrates; and
causing a tightly attached state between the upper substrate and the lower substrate by causing the weight of the upper substrate and said attracting force to bring the lower surface of the upper substrate into a contact state with the upper surface of the lower substrate via the volatile liquid, and by allowing evaporation of the volatile liquid between the lower surface and the upper surface, without application of an external pressing force to the upper substrate or the lower substrate.

2. A method for laminating substrates according to claim 1, further comprising subjecting at least one of the lower surface of the upper substrate and the upper surface of the lower substrate to a hydrophilic treatment.

3. A method for laminating substrates according to claim 1, further comprising subjecting at least one of the lower surface of the upper substrate and the upper surface of the lower substrate to a smoothing treatment.

4. A method for laminating substrates according to claim 1, further comprising forming a groove on at least one of the lower surface of the upper substrate and the upper surface of the lower substrate.

5. A method for laminating substrates according to claim 4, wherein said forming of the groove comprises forming the groove to be substantially symmetrical with respect to a virtual center line.

6. A method for laminating substrates according to claim 4, wherein said forming of the groove comprises forming the groove with its depth and width substantially the same.

7. A method for laminating substrates according to claim 4, wherein said forming of the groove comprises forming the groove with a vertical cross-sectional area that increases continuously or discontinuously toward an outer peripheral portion of one of the upper and lower substrates.

8. A method for laminating substrates according to claim 1, further comprising forming a thin film made of dielectric material or metallic material on at least one of the lower surface of the upper substrate and the upper surface of the lower substrate.

9. A method for laminating substrates according to claim 1, wherein said volatile liquid is composed of an organic solvent having a boiling point of 100° C. or lower at 1 atmospheric pressure.

10. A method for laminating substrates according to claim 1, wherein at least one of the upper substrate and the lower substrate is an oxide crystal substrate.

11. A method for laminating substrates according to claim 1, wherein at least one of the upper substrate and the lower substrate is a substrate made of $LiNb_xTa_{(1-x)}O_3$ crystal wherein x is greater than or equal to 0 and less than or equal to 1.

12. A method for laminating substrates according to claim 1, wherein said positioning of the lower surface of the upper substrate adjacent to the upper surface of the lower substrate comprises holding the upper substrate with a holding mechanism, and wherein said causing the weight of the upper substrate and said attracting force to bring the lower surface of the upper substrate into a contact state with the upper surface of the lower substrate comprises releasing said holding mechanism.

13. A method for laminating substrates according to claim 1, wherein the lower surface of the upper substrate partially contacts the upper surface of the lower substrate.

14. A method for laminating substrates according to claim 1, wherein said volatile liquid comprises an organic solvent.

15. A method for laminating substrates according to claim 14, wherein the organic solvent comprises acetone.

16. A method for laminating substrates according to claim 1, wherein the air space between the lower surface of the upper substrate and the upper surface of the lower substrate is several micrometers (μm) to several tens of μm.

17. A method for laminating substrates according to claim 1, wherein the air space between the lower surface of the upper substrate and the upper surface of the lower substrate is less than 10 μm.

18. A method for laminating substrates according to claim 1, wherein said interposing of the volatile liquid comprises extruding the volatile liquid between the lower surface and the upper surface by a capillary action.

19. A method for laminating substrates according to claim 18, wherein said extruding of the volatile liquid comprises utilizing a nozzle to extrude the volatile liquid.

20. A method for laminating substrates according to claim 1, wherein said interposing of the volatile liquid comprises forcibly injecting the volatile liquid between the lower surface and the upper surface.

21. A method for laminating substrates according to claim 1, wherein said positioning a lower surface of an upper substrate adjacent to an upper surface of a lower substrate includes positioning the upper substrate and the lower substrate so as to allow for a capillary action of the volatile liquid between the upper substrate and the lower substrate, and
wherein said interposing of the volatile liquid comprises providing the volatile liquid into the air space and allowing the volatile liquid to fill the air space via the capillary action.

22. A method for laminating substrates according to claim 1, wherein said attracting force is an interfacial tension.

23. A method for laminating substrates, comprising:
positioning a lower surface of an upper substrate adjacent to an upper surface of a lower substrate such that the upper surface and the lower surface are mutually facing so as to define an air space between the lower surface and the upper surface;
after said positioning of the lower surface of the upper substrate adjacent to the upper surface of the lower substrate so as to define the air space, interposing a volatile liquid into the air space between the lower surface of the upper substrate and the upper surface of the lower substrate so as to replace air in the air space and cause an attracting force to arise between the volatile liquid and the upper and lower substrates; and
causing a tightly attached state between the upper substrate and the lower substrate by causing the weight of the upper substrate and said attracting force to bring the lower surface of the upper substrate into a contact state with the upper surface of the lower substrate via the volatile liquid, and by allowing evaporation of the volatile liquid between the lower surface and the upper surface, without application of an external pressing force to the upper substrate or the lower substrate,
wherein said interposing of the volatile liquid comprises extruding the volatile liquid between the lower surface and the upper surface by a capillary action;
wherein the air space is formed by a distance between the lower surface of the upper substrate and the upper surface of the lower substrate, the distance being less than 10 μm.

* * * * *

UNITED STATES PATENT AND TRADEMARK OFFICE
CERTIFICATE OF CORRECTION

PATENT NO. : 7,608,520 B2 Page 1 of 1
APPLICATION NO. : 10/569100
DATED : October 27, 2009
INVENTOR(S) : Tomoya Sugita et al.

It is certified that error appears in the above-identified patent and that said Letters Patent is hereby corrected as shown below:

ON THE TITLE PAGE

On page 1, left column, in item (54), Title and Col. 1, lines 2-3, please change "METHOD FOR BONDING SUBSTATE, AND DIRECT BONDED SUBTRATE" to -- METHOD FOR LAMINATING SUBSTRATES, LAMINATED SUBSTRATE OBTAINED THEREFROM, AND DIRECTLY JOINED SUBSTRATE --.

Signed and Sealed this

Sixteenth Day of March, 2010

David J. Kappos
*Director of the United States Patent and Trademark Office*